United States Patent [19]

Nishizawa et al.

[11] Patent Number: 5,037,862

[45] Date of Patent: Aug. 6, 1991

[54] POLYAMIDE-IMIDE RESIN PASTES

[75] Inventors: Hiroshi Nishizawa; Kenji Suzuki; Yoshiyuki Mukoyama, all of Hitachi, Japan

[73] Assignee: Hitachi Chemical Company, Ltd., Tokyo, Japan

[21] Appl. No.: 204,190

[22] Filed: Jun. 8, 1988

[30] Foreign Application Priority Data

Jun. 11, 1987 [JP] Japan ................. 62-145761
Jul. 30, 1987 [JP] Japan ................. 62-191444

[51] Int. Cl.$^5$ ................. C08K 7/16; C08L 77/00
[52] U.S. Cl. ................. 523/223; 524/514; 524/507; 524/538; 524/539; 524/600
[58] Field of Search ......... 524/600, 507, 514, 538, 524/539; 523/223

[56] References Cited

U.S. PATENT DOCUMENTS

| | | | |
|---|---|---|---|
| 4,026,876 | 5/1977 | Bateman et al. | 524/600 |
| 4,354,965 | 10/1982 | Lee et al. | 524/600 |
| 4,360,633 | 11/1982 | Bolon et al. | 524/600 |
| 4,495,321 | 1/1985 | Arnold | 524/600 |
| 4,496,715 | 1/1985 | Sattler | 524/600 |
| 4,497,944 | 2/1985 | Nishizawa et al. | 524/600 |
| 4,525,507 | 6/1985 | Chaker et al. | 524/600 |
| 4,574,097 | 3/1986 | Honeycutt | 524/539 |
| 4,640,949 | 2/1987 | Wagman | 524/538 |

FOREIGN PATENT DOCUMENTS

| | | | |
|---|---|---|---|
| 2366046 | 6/1977 | Fed. Rep. of Germany | 524/600 |
| 32943 | 3/1977 | Japan | 524/600 |
| 182848 | 10/1984 | Japan | 524/538 |
| 182849 | 10/1984 | Japan | 524/538 |
| 182850 | 10/1984 | Japan | 524/538 |
| 182851 | 10/1984 | Japan | 524/538 |

*Primary Examiner*—John Kight, III
*Assistant Examiner*—Dennis R. Daley
*Attorney, Agent, or Firm*—Frishauf, Holtz, Goodman & Woodward

[57] ABSTRACT

Disclosed is a polyamide-imide resin paste which comprises polyamide-imide resin solution dissolved in a non-nitrogen-containing solvent, wherein resin fine particles are dispersed in the solution in an amount of 1 to 50% by weight relative to the resulting polyamide-imide resin paste.

According to the present invention, there can be provided a paste which does not cause any clogging of screen due to adhesion of the paste even in repeated printings over a long period of time and shows an excellent mechanical stability of a paste in printing.

22 Claims, No Drawings

POLYAMIDE-IMIDE RESIN PASTES

BACKGROUND OF THE INVENTION

This invention relates to a polyamide-imide resin paste.

Usually, a resin solution as such does hardly show a thixotropic property. Thixotropy is defined as a phenomenon wherein an apparent viscosity is temporarily lowered due to deformation even in an isothermal state. This property is a fluidizing property indispensable for a screen printing paste in which a viscosity is required to be temporarily lowered at a high shear speed in printing to cause a fluidized state and further no sagging or running is required after transferred onto a material. One method for giving a thixotropic property to a resin solution is to disperse resin fine particles as a filler into a resin solution to form a paste. A wide variety of such pastes are known.

As the resin solution which is to be applied for use not requiring great resistance, there have been proposed resin solutions of, for example, a rosin-modified phenol resin, a rosin-modified maleic resin, a melamine resin, an epoxy resin and the like, while there are known, for the use requiring a high heat resistance, resin solutions of a polyamide resin which is a precursor of a polyimide resin, a solvent-soluble polyimide resin and the like. Also, as the resin fine particles which may be dispersed in such a resin solution to form a paste, there are known fine particles of an aliphatic polyamide resin, a melamine resin, an epoxy resin, a phenol resin and the like for the use not requiring heat resistance so much, and fine particles of a polyimide resin and the like for the use requiring a high heat resistance.

For uses requiring a high heat resistance such as a semiconductor chip, the surface of which is to be coated with a paste, there has been employed a paste in which polyimide resin fine particles are dispersed in the polyamide resin or polyimide resin solution as stated above. However, where a paste with the vehicle of a polyamide resin solution is employed, there is the disadvantage that a higher temperature and a longer period of time is necessary for curing in forming a surface-protective film on a semiconductor chip, which leads to a remarkable decrease in productivity. Furthermore, these materials tend to shrink when cured to break down wires. Moreover, where a paste with the vehicle of a polyimide resin solution is employed, the above-depicted problems could be solved, but there remains a problem in regard to cost, for application to a wide use, owing to a high expense of the polyimide resin.

In addition, such highly heat-resistant resins have been employed in the form of a solution in a highly polar nitrogen-containing solvent, e.g., N-methylpyrrolidone because of their poor solubility. However, the screen-printing paste prepared by employing a nitrogen-containing solvent has a disadvantage that the paste would adhere onto screen during printing to cause clogging and thus make printing impracticable because of a high hygroscopicity of the nitrogen-containing solvent. Besides, the paste has another disadvantage that it tends to swell or dissolve the emulsion constituting the screen-printing plate owing to a superior dissolving ability of the nitrogen-containing solvent, which results in a shortened life of the plate.

SUMMARY OF THE INVENTION

This invention is to solve such problems and preferably to provide a polyamide-imide resin paste having a thixotropic property.

This invention is directed to a polyamide-imide resin paste which comprises polyamide-imide resin solution dissolved in a non-nitrogen-containing solvent, wherein resin fine particles are dispersed in said solution in an amount of 1 to 50 % by weight relative to the resulting polyamide-imide resin paste.

DESCRIPTION OF THE PREFERRED EMBODIMENTS

As the non-nitrogen-containing solvent which may be employed in this invention, there may be preferably employed lactones such as γ-butyrolactone, ε-caprolactone and the like; alicyclic ketones such as cyclohexanone, 4-methylcyclohexanone and the like; ethers such as tetrahydrofuran, dioxane, 1,2-dimethoxyethane, diethylene glycol dimethyl ether, triethylene glycol dimethyl ether, tetraethylene glycol dimethyl ether and the like; phenols such as phenol, cresols, xylenols and the like; chlorinated aromatic type solvents such as m-chlorophenol, p-chlorophenol and the like; dimethylsulfoxide; sulfolane and the like. They may be employed either alone or in admixture therewith.

In consideration of non-swelling property or non-dissolving property to the emulsion in a screen-printing plate, ether such as tetrahydrofuran, dioxane, diethylene glycol dimethyl ether, triethylene glycol dimethyl ether and tetraethylene glycol dimethyl ether; and alicyclic ketones such as cyclohexane and 4-methylcyclohexane are particularly preferably employed.

The polyamide-imide resin solution for this invention is obtained by dissolving a polyamide-imide resin soluble in said non-nitrogen-containing solvent in the above-mentioned non-nitrogen-containing solvent. As the polyamide-imide resin described above, there may preferably be employed a polyamide-imide resin which is prepared from trimellitic acid or a reactive acid derivative thereof and a diamine or a diisocyanate and is soluble in a non-nitrogen-containing solvent; a polyamide-imide resin which is prepared from trimellitic acid or a reactive acid derivative thereof, a lactam and a diamine or a diisocyanate and is soluble in a non-nitrogen-containing solvent.

The reactive acid derivative thereof in the present invention means an anhydride, a halide, an ester, an amide and ammonium salts of trimellitic acid.

More specifically, as the reactive acid derivative thereof, there may preferably be employed trimellitic acid anhydride, trimellitic acid anhydride monochloride, 1,4-dicarboxy-3-N,N-dimethylcarbamoylbenzene, 1,4-dicarboxy-3-carbophenoxybenzene, 1,4-dicarbomethoxy-3-carboxybenzene, ammonium salts composed of trimellitic acid and ammonia, dimethylamine or triethylamine. In particular, trimellitic acid anhydride and trimellitic acid anhydride monochloride are preferred. If necessary, they may be employed either alone or in admixture therewith.

As the diamine, there may be employed, for example, aliphatic, alicyclic, heterocyclic, aromatic or silicon diamines.

Above all, there may preferably be employed, for example, 4,4'-diaminodiphenyl ether, 3,4'-diaminodiphenyl ether, 2,4'-diaminodiphenyl ether, 4,4'-diaminodiphenylmethane, 3,4'-diaminodiphenylmethane, 4,4'-diaminodiphenyl sulfone, 3,3'-diaminodiphenyl sulfone, 4,4'-benzophenone diamine, 3,3'-benzophenone diamine, metha-phenylenediamine, paraphenylenediamine, 4,4'-di(4-aminophenoxy)phenyl sulfone, 4,4'-di(3-aminophenoxy)phenyl sulfone, 4,4'-di(4-aminophenoxy)benzene, 3,3'-di(4-aminophenoxy)benzene, 4,4'-di(3-aminophenoxy)benzene, 2,4-diaminotoluene, 2,6-diaminotoluen 4,4'-diaminodiphenylpropane, an alkylated aromatic diamine having the following Formula I:

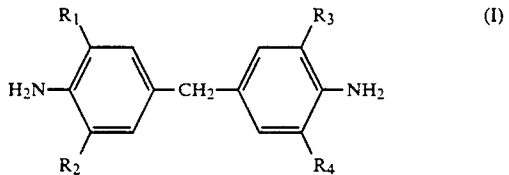

wherein $R_1$, $R_2$, $R_3$ and $R_4$ individually represent an alkyl group having 1 to 6 carbon atoms, which may be the same or different, a silicondiamine having the following Formula II:

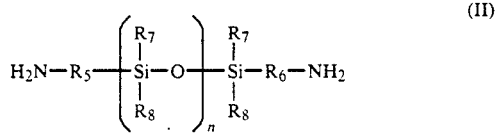

wherein $R_5$ and $R_6$ individually represent a divalent hydrocarbyl group, $R_7$ and $R_8$ individually represent a monovalent hydrocarbyl group, $R_5$ and $R_6$, and $R_7$ and $R_8$ may be the same or different and n is an integer of 1 or more, and an aromatic diamine having ether linkages represented by Formula III:

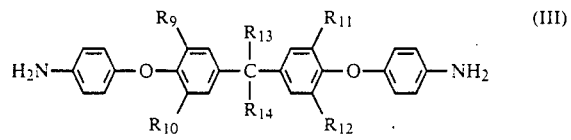

wherein $R_9$, $R_{10}$, $R_{11}$ and $R_{12}$ represent hydrogen, a lower alkyl group, a lower alkoxy group, chlorine or bromine, which may be the same or different, $R_{13}$ and $R_{14}$ represent hydrogen, a methyl group, an ethyl group, a propyl group, a trifluoromethyl group or a trichloromethyl group, which may be the same or different.

In consideration of heat resistance and solubility in ethers or alicyclic ketones, the alkylated aromatic diamine represented by Formula I and the aromatic diamine having ether linkages represented by Formula III may particularly be preferably employed.

As the alkylated aromatic diamine represented by Formula I, there may typically be mentioned, for example, 4,4'-methylene-bis-(2,6-dimethylaniline), 4,4'-methylene-bis-(2,6-diethylaniline), 4,4'-methylene-bis-(2,6-di-n-propylaniline), 4,4'-methylene-bis-(2,6-diisopropylaniline), 4'-methylene-bis-(2,6-di-n-butylaniline), 4,4'-methylene-bis-(2,6-diisobutylaniline), 4,4'-methylene-bis-(2,6-di-n-octylaniline), 4,4'-methylene-bis-(2,6-di-n-hexylaniline), 4,4'-methylene-bis-(2-methyl-6-ethylaniline), 4,4'-methylene-bis-(2-methyl-6-isopropylaniline), 4,4'-methylene-bis-(2-ethyl-6-isopropylaniline) and the like. In particular, there may preferably be mentioned those represented by Formula I wherein $R_1$, $R_2$, $R_3$ and $R_4$ individually represent a methyl group or an ethyl group and inter alia $R_1$ and $R_3$ individually represent a methyl group and $R_2$ and $R_4$ individually represent an ethyl group.

As the aromatic diamine having ether linkages represented by Formula III, there may be mentioned, for example, 2,2-bis[4-(4-aminophenoxy)phenyl]propane, 2,2-bis[3-methyl-4-(4-aminophenoxy) phenyl]propane, 2,2-bis[3-bromo-4-(4-aminophenoxy) phenyl]propane, 2,2-bis[3-ethyl-4-(4-aminophenoxy)phenyl]propane, 2,2-bis[3-propyl-4-(4-aminophenoxy)-phenyl]propane, 2,2-bis[3-isopropyl-4-(4-aminophenoxy)phenyl]-propane, 2,2-bis[3-butyl-4-(4-aminophenoxy)phenyl]propane, 2,2-bis[3-sec-butyl-4-(4-aminophenoxy)phenyl]propane, 2,2-bis[3-methoxy-4-(4-aminophenoxy)phenyl]propane, 2,2-bis-[3-ethoxy-4-(4-aminophenoxy)phenyl]propane, 2,2-bis[3,5-dimethyl-4-(4-aminophenoxy)phenyl]propane, 2,2-bis[3,5-dichloro-4-(4-aminophenoxy)phenyl]propane, 2,2-bis[3,5-dibromo-4-(4-aminophenoxy)phenyl]propane, 2,2-bis[3,5-dimethoxy-4-(4-aminophenoxy)phenyl]propane, 2,2-bis[3-chloro-4-(4-aminophenoxy)-5-methyl-phenyl]propane, 1,1-bis[4-(4-aminophenoxy)phenyl]ethane, 1,1-bis[3-methyl -4-(4-aminophenoxy)phenyl]ethane, 1,1bis[3-chloro-4-(4-aminophenoxy)phenyl]ethane, 1,1-bis[3-bromo-4-(4-aminophenoxy)phenyl]ethane, 1,1-bis[3-ethyl-4-(4-aminophenoxy)phenyl]ethane, 1,1-bis[3-propyl-4-(4-aminophenoxy)phenyl]ethane, 1,1-bis[3-isopropyl-4-(4-aminophenoxy)phenyl]ethane, 1,1-bis[3-butyl-4-(4-aminophenoxy)phenyl]ethane, 1,1-bis[3-sec-butyl-4-(4-aminophenoxy)phenyl]ethane, 1,1-bis[3-methoxy-4-(4-aminophenoxy)phenyl]ethane, 1,1-bis[3-ethoxy-4-(4-aminophenoxy)phenyl]ethane, 1,1-bis[3,5-dimethyl-4-(4-aminophenoxy)phenyl]ethane, 1,1-bis[3,5-dichloro-4-(4-aminophenoxy)phenyl]ethane, 1,1-bis[3,5-dibromo-4-(4-aminophenoxy)phenyl]ethane, 1,1-bis[3,5-dimethoxy-4-(4-aminophenoxy)phenyl]ethane, 1,1-bis[3-chloro-4-(4-aminophenoxy)-5-methylphenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3-bromo-4-(4-aminophenoxy)phenyl]methane, bis[3-ethyl-4-(4-aminophenoxy)phenyl]methane, bis[3-propyl-4-(4-aminophenoxy)phenyl]methane, bis[3-isopropyl-4-(4-aminophenoxy)phenyl]methane, bis[3-butyl-4-(4-aminophenoxy)phenyl]methane, bis[3 sec-butyl-4-(4-aminophenoxy)phenyl]methane, bis[3-methoxy-4-(4-aminophenoxy)phenyl]methane, bis[3-ethoxy-4-(4-aminophenoxy)phenyl]methane, bis[3,5-dimethyl-4-(4-aminophenoxy)phenyl]methane, bis[3,5-dichloro-4-(4-aminophenoxy)phenyl]methane, bis[3,5-dibromo-4-(4-aminophenoxy)phenyl]methane, bis[3,5-dimethoxy-4-(4-aminophenoxy)phenyl]methane, bis[3-chloro-4-(4-aminophenoxy)-5-methylphenyl]methane, 1,1,1,3,3,3,-hexafluoro-2,2-bis[4-(4-aminophenoxy)phenyl]propane, 1,1,1,3,3,3,-hexachloro-2,2-bis[4-(4-aminophenoxy)-phenyl]propane, 3,3-bis[4-(4-aminophenoxy)phenyl]pentane, 1,1-bis[4-(4-aminophenoxy)phenyl]propane, 1,1,1,3,3,3,-hexafluoro-2,2-bis[3,5-dimethyl-4-(4-aminophenoxy)phenyl]propane, 1,1,1,3,3,3,-hexachloro -2,2-bis[3,5-dimethyl-4-(4-aminophenoxy)phenyl]propane, 3,3-bis[3,5-dimethyl-4-(4-aminophenoxy)phenyl]pentane, 1,1-bis[3,5-dimethyl-4-(4-aminophenoxy)phenyl]propane, 1,1,1,3,3,3,-hexafluoro-2,2-bis[3,5-dibromo-4-(4-amino phenoxy)phenyl]propane, 1,1,1,3,3,3,-hexachloro-2,2-bis -[3,5-dibromo-4-(4-aminophenoxy)phenyl]propane, 3,3-bis[3,5-dibromo-4-(4-amino phenoxy)phenyl]pentane, 1,1-bis[3,5-dibromo-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3,3,-hexafluoro-2,2-bis[3-methyl-4-(4-aminophenoxy)phenyl]propane, and among those described above 2,2-bis[4-(4-aminophenoxy)phenyl]propane is a typical example. If necessary, the diamines described above are used as a mixture thereof. It is especially preferred for improving adhesion to a base material to employ a combination of 0.01 to 0.3 mole of the silicondiamine of Formula II and 0.99 to 0.7 mole of the above-mentioned aromatic diamine. If the slicondiamine is in excess, heat resistance is lowered, and if too small, adhesion tends to be reduced.

Further, when the diamine having ether linkages represented by Formula III is used, it may be employed, if necessary, in combination with at least one of other known diamines described above, for example, 4,4'-diaminodiphenyl ether, 3,4'-diaminodiphenyl ether, 2,4'-diaminodiphenyl ether, 4,4'-diaminodiphenylmethane, 3,4'-diaminodiphenylmethane, 4,4'-diaminodiphenyl sulfone, 3,3'-diaminodiphenyl sulfone, 4,4'-benzophenone diamine, 3,3'-benzophenone diamine, metha-phenylenediamine, para-phenylenediamine, 4,4'-di(4-aminophenoxy)phenyl sulfone, 4,4'-di(3-aminophenoxy)phenyl sulfone, 4,4'-di(4-aminophenoxy)benzene, 3,3'-di(4-aminophenoxy)benzene, 4,4'-di(3-aminophenoxy)benzene, 2,4-diaminotoluene, 2,6-diaminotoluene, 4,4'-diaminodiphenylpropane, an alkylated aromatic diamine having the following Formula I:

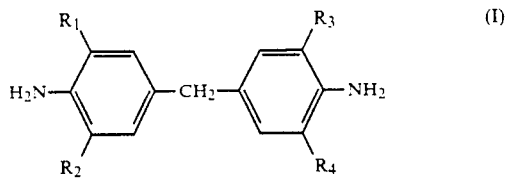

wherein $R_1$, $R_2$, $R_3$ and $R_4$ individually represent an alkyl group having 1 to 6 carbon atoms, which may be the same or different, and a silicondiamine having the following Formula III:

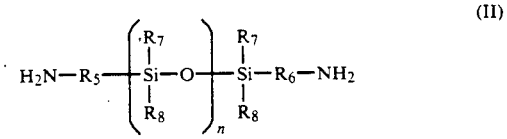

wherein $R_5$ and $R_6$ individually represent a divalent hydrocarbyl group, $R_7$ and $R_8$ individually represent a monovalent hydrocarbyl group, $R_5$ and $R_6$, and $R_7$ and $R_8$ may be the same or different and n is an integer of 1 or more, and more preferably $R_5$ and $R_6$ individually represent an alkylene group having 1 to 5 carbon atoms, a phenylene group or an alkyl-substituted phenylene group, and $R_7$ and $R_8$ individually represent an alkylene group having 1 to 5 carbon atoms, a phenylene group or an alkyl-substituted phenylene group.

These diamines to be combined may preferably be employed in an amount of 30 mole % or less relative to the total amount of the diamines. If beyond 30 mole %, it is not preferable since the solubility or heat resistance of the resin may adversely be influenced.

In case where the above diamines are employed, the total amount of the trimellitic acid or the reactive acid derivative thereof may preferably be 90 to 130 mole %, particularly 100 mole % or approximately 100 mole %, relative to the amount of the diamine.

The polyamide-imide resin of the present invention can be prepared by condensation polymerization of trimellitic acid or a reactive acid derivative thereof with a diamine described above, according to known methods such as solution polymerization (for example, Japanese Patent Publication Nos. 19274/1969, 4077/1974 and 15637/1967 and Japanese Unexamined Patent Publication No. 14622/1982), precipitation polymerization (for example, Japanese Patent Publication No. 44719/1979), non-aqueous dispersion polymerization (for example, U.S. Pat. No. 4,427,822) and melting polymerization (Japanese Patent Publication No.8910/1965). From view of cost, it is preferable to employ the solution polymerization in which trimettlic acid anhydride is condensated with a diamine in the presence of a dehydrating catalyst.

The polyamide-imide resins of the present invention prepared by employing a diamine contain, for example, linkage modes represented by the following Formulas A, B and C:

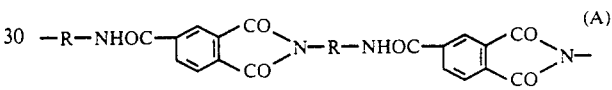

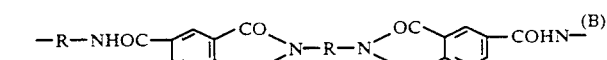

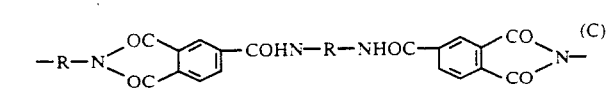

wherein, R represents the diamine residue described above.

In the present invention, by employing a polyamine having 3 or more functionalities as a part of the above-mentioned diamine, a cross-linked polyamide-imide resin may be prepared. As the polyamine described above, there may be mentioned, for example, aromatic triamines such as 1,2,4-triaminobenzene; aromatic tetramines such as 1,2,4,5-tetraaminobenzene and 3,3'-diaminobenzidine; and aromatic polyamines having the following Formula IV:

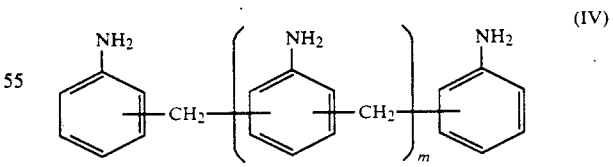

(m is an integer of 0 to 10).

As the diisocyanate to be employed for preparing the polyamide-imide resin of the present invention, there may be employed, for example, those diisocyanates prepared by reacting the above-mentioned diamines with phosgene or thionyl chloride. Also, there may be employed those polyisocyanates prepared from polyamines in a similar manner. Further, there may be employed those diisocyanate trimers containing an isocyanurate ring prepared by a trimerization reaction of the diisocyanates.

In consideration of heat resistance and solubility in a non-nitrogen-containing solvent such as ethers, alicyclic ketones and the like, there may be particularly preferably employed the alkylated aromatic diisocyanate prepared by replacing the amino group in the alkylated aromatic diamine of Formula I by an isocyanate group.

The polyamide-imide resin prepared from trimellitic acid or reactive acid derivatives thereof, a lactam, and a diamine or a diisocyanate, which is disclosed, for example in Japanese Unexamined Patent Publication No. 41218/1981, is soluble in a non-nitrogen-containing solvent such as a phenol and the like. Trimellitic acid or a reactive acid derivative thereof, diamine and diisocyanate as stated above may preferably be employed. As the lactam, there may preferably be employed ε-caprolactam. As other polyamide-imide resins of the present invention, there may be favourably employed those prepared by reacting a tetrabasic acid dianhydride, a dicarboxylic acid and the above-mentioned diamine, polyamine, diisocyanate or polyisocyanate. As the tetrabasic acid dianhydride, there may be employed, for example, tetracarboxylic acid dianhydrides of aliphatic-, alicyclic-, heterocyclic-, aromatic-, silicon-type in which two carbonyl groups of the acid anhydride group are bound to adjacent carbon atoms. Among those, there may be employed tetrabasic acid dianhydrides such as 1,2,3,4-butanetetracarboxylic acid, cyclopentanetetracarboxylic acid, ethylenetetracarboxylic acid, bicyclo[2,2,2]-oct-(7)-ene-2:3, 5:6-tetracarboxylic acid, pyromellitic acid, 3,3',4,4'-benzophenonetetracarboxylic acid, bis(3,4-dicarboxyphenyl)ether, 2,3,6,7-naphthalenetetra carboxylic acid, 1,2,5,6-naphthalenetetracarboxylic acid, ethylene glycol bistrimellitate, 2,2-bis(3,4-dicarboxyphenyl)propane, 2,2',3,3'- or 3,3',4,4'-biphenyltetracarboxylic acid, perillene-3,4,9,10-tetracarboxylic acid, bis-3,4-dicarboxyphenyl sulfone, 2,2-bis[4-(2,3- or 3,4-dicarboxyphenoxy)-phenyl]propane, 1,1,1,3,3,3-hexafluoro-2,2-bis[4-(2,3- or 3,4-dicarboxyphenoxy)phenyl]propane, thiophene-2,3,4,5-tetracarboxylic acid, pyrazinetetracarboxylic acid and a tetrabasic acid dianhydride having the following Formula V:

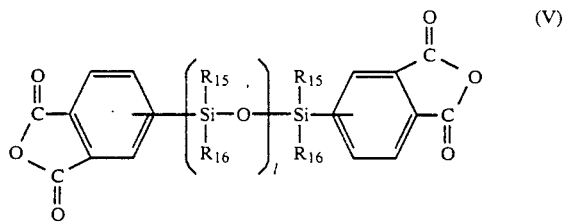

wherein $R_{15}$ and $R_{16}$ may be the same or different and each represent a monovalent hydrocarbyl group and/ is an intefer of 1 or more, and more preferably $R_{15}$ and $R_{16}$ individually represent a methyl group and/ is 1 or 2.

Further, as an acid component, there may be employed at least one of diimidocarboxylic acids obtained by reacting a known dicarboxylic acid such as terephthalic acid, isophthalic acid, phthalic acid and the like, the above mentioned known diamine and trimellitic acid or a reactive acid derivative thereof.

In consideration of heat resistance and cost, pyromellitic acid dianhydride, 3,3'4,4'-benzophenonetetracarboxylic acid dianhydride and 3,3'4,4'-biphenyltetracarboxylic acid dianhydride are particularly preferable.

As the dicarboxylic acid, there may preferably be employed aromatic dicarboxylic acids such as terephthalic acid, isophthalic acid, phthalic acid and the like or acid chloride compounds thereof.

These tetrabasic acid dianhydrides, dicarboxylic acids and diimide dicarboxylic acids may preferably be employed at a ratio of 30 mole % or less relative to the total acid component. If beyond 30 mole %, it is not preferable since the solubility or heat resistance may adversely be influenced.

The above materials may be employed either alone or in combination with two or more thereof. It is to be noted that other polyamide-imide resin than the foregoing, so long as it is soluble in a non-nitrogen-containing solvent, may be also employed for this invention.

A molecular weight of the polyamide-imide resin in this invention may preferably be approximately 0.3 to 2.0 dl/g in terms of a reduced viscosity, in view of a film-forming property and a viscosity of the paste.

The reduced viscosity described above is a value as measured at a temperature of 30° C. by using dimethylformamide as a solvent and a sample concentration of 0.5 g/dl.

A concentration of the polyamide-imide resin in a solution (a resin concentration) is 5 to 50 % by weight, particularly preferably 10 to 40 % by weight. If beyond 50 % by weight, fluidity may be lost when formed into a paste and, if less than 5 % by weight, it may become difficult to form a thick coating film.

The resin fine particles in this invention is not particularly limited and may be any of those that they may be dispersed in the above polyamide-imide solution to form a paste and, preferably, a thixotropy index of the paste may be brought to 1.5 or more. There may preferably be employed the resin fine particles having particle diameter of not more than 30 μm, a maximum particle diameter of not more than 40 μm, a tap bulk density of not more than 0.8 g/cm³ and a specific surface area of not less than 1 m²/g. If an average particle diameter is beyond 30 μm, it may difficult to prepare a past having a thixotropy index of not less than 1.5. If a maximum particle diameter is beyond 40 μm, appearance and adhesion of a coated film may be damaged. If a tap bulk density is beyond 0.8 g/cm³ and a specific surface area is less than 1 m²/g, it may become difficult to prepare a paste having a thixotropy index of not less than 1.5.

As the resin for the resin fine particles, there may be employed a spherical or amorphous form of a straight or three dimensional cross-linked resin which is insoluble or swollen in the solvent described above. Specifically speaking, there may be employed, for example, polyamideimide resin fine particles, polyimide resin fine particles, polyamide resin fine particles, epoxy resin fine particles, polyester resin fine particles, phenol resin fine particles, melamine resin fine particles, cross-linked benzoguanamine resin fine particles and the like. In consideration of heat resistance and easiness in preparation, there may preferably be employed aromatic polyamide-imide resin fine particles, aromatic polyimide resin fine particles or aromatic polyamide resin fine particles.

And, it is preferable to employ resin fine particles having a spherical shape. That is, spherical resin fine particles may be readily prepared by dispersion polymerization, precipitation polymerization and the like and thus are advantageous with regard to their production cost. Further, they have an advantage to be easily controlled in various particle properties such as a particle diameter, a porosity and the like. As the above described spherical resin fine particles, there may preferably be employed, for example, spherical polyamide-imide resin fine particles and polyimide resin fine particles prepared by non-aqueous dispersion polymerization (as disclosed in, for example, Japanese Patent Publication No. 48531/1985 and Japanese Unexamined Patent Publication No. 157821/1983), polyamide resin fine particles (as disclosed in, for example, Japanese Unexamined Patent Publication No. 230018/1984), and spherical precipitation-polymerized resin fine particles prepared by reacting a tetrabasic acid or a tetrabasic acid dianhydride with a polyamine or a polyisocyanate (as disclosed in, for example, Japanese Patent Application No. 4296/1987).

An average particle diameter as referred to herein is a volumetric average particle diameter as measured with a 200 μm aperture tube by means of Coulter Counter (produced by Coulter Counter Co. Ltd., TA - II Type).

A tap bulk density is measured by means of a measuring cylinder as a simplified evaluation method.

A specific surface area is a value as measured according to a nitrogen adsorption method by means of a specific surface area automatic measuring device (produced by Micromeritix Co., Ltd., 2200 Type).

An amount of the resin fine particles to be used in this invention should be in the range of 1 to 50 % by weight relative to the resulting polyamide-imide resin paste. If less than 1 % by weight, it may become difficult to prepare a paste having a thixotropy index of not less than 1.5, and, if beyond 50 % by weight, fluidity of the resulting paste will be damaged. In particular, 5 to 40 % by weight may be preferred.

The polyamide-imide resin paste in this invention preferably has a thixotropy index of not less than 1.5. If less than 1.5, the printed paste could not be bestowed with a printability so as to exert a practically sufficient pattern precision without any sags or runs after transferred onto a base material.

A thixotropy index of the paste as referred to herein can be expressed in terms of a ratio of an apparent viscosity at the number of revolutions of 1 rpm, $\eta_1$, to that at the number of revolutions of 10 rpm, $\eta_{10}$, i.e., $\eta_1/\eta_{10}$, as measured with a sample amount of 0.4 g at a measurement temperature of 25° C. by means of the E type viscometer (produced by Tokyo Keiki K. K., EHD - U Type).

For dispersing the resin fine particles in a polyamide-imide resin solution, one may usually apply roll milling, mixer blending and others commonly employed in a paint field. There is no particular limitation thereto, provided that a sufficient dispersion can be accomplished. Plural times of kneading by means of three rollers are most preferred.

The present paste can be coated onto a base material and then stoved finally at 150 to 300° C. for 1 to 100 minutes to form a tough coated film.

The present paste may include, if necessary, an antifoaming agent, a pigment, a dye, a plasticizer, an antioxidant, etc.

The polyamide-imide resin paste of this invention may be widely utilized as an α-ray masking film for semiconductor chips wherein a high heat resistance should be required, an insulating film, an insulating film for printed base plates, various types of printing inks, an adhesive and the like and thus industrially very useful.

The polyamide-imide resin paste of this invention can be print-coated by screen printing and, especially, is excellent in a mechanical stability of the paste in repeated printings and a non-swelling ability or non-dissolving ability to an emulsion which is a material for forming a plate. Moreover, the present paste can provide an adequate thixotropic property and a superior pattern precision by printing.

EXAMPLES

This invention will be illustrated by way of the following Examples and Comparative example.

EXAMPLE 1

(1) Preparation of a polyamide-imide resin solution
(a) Synthesis of an aromatic diisocyanate trimer

| Component | Amount used (g) |
| --- | --- |
| Tolylene diisocyanate | 600 |
| Xylene | 600 |
| 2-Dimethylaminoethanol (catalyst) | 1.8 |

The above components were placed into a four-necked flask equipped with a thermometer and a stirrer and a temperature was raised to 140° C. in nitrogen stream. Reaction was allowed to proceed at that temperature until a content of isocyanate group (initial concentration: 48 % by weight) reached 25 % by weight. Its IR absorption spectrum showed absorption of isocyanurate ring at 1,710 cm$^{-1}$ and 1,410 cm$^{-1}$ and absorption of isocyanate group at 2,260 cm$^{-1}$.

(b) Preparation of a polyamide-imide resin solution

| Component | Amount used (g) | (equivalent) |
| --- | --- | --- |
| Diisocyanate trimer synthesized as described in (a) (50% solution) | 33.3 | 0.100 |
| 4,4'-Diphenylmethane diisocyanate | 113.3 | 0.91 |
| Trimellitic acid anhydride | 96.0 | 1.00 |
| ε-Caprolactam | 36.6 | 0.65 |
| Cresol | 300 | |

The above components other than trimellitic acid anhydride were placed into a four-necked flask equipped with a thermometer, a stirrer and a fractionating column and a temperature was raised to 180° C. Reaction was conducted for 90 minutes. Thereafter, trimellitic acid anhydride was added thereto and a temperature was raised to 215° C. and reaction was allowed to proceed at that temperature for 15 hours to give a cresol solution of a polyamide-imide resin having a reduced viscosity (dimethylformamide, 0.5 g/dl, 30° C.; these will be similarly applied hereinafter) of 0.24 dl/g. This solution was further diluted with cresol to produce a polyamide-imide resin solution having a resin concentration of 20 % by weight.

(2) Preparation of resin fine particles

Into a four-necked flask equipped with a thermometer, a stirrer, an inlet tube of nitrogen and a water content analyzer were placed 218 g (1 mole) of pyromellitic acid dianhydride and 1672 g of N-methylpyrrolidone (water content, 0.03 %) whilst nitrogen gas was passed therethrough, a temperature was raised to 50° C. with stirring and a complete dissolution was achieved by maintaining at that temperature for 0.5 hour to form a uniform solution. To the solution were added 100 g (0.5 mole) of 4,4'-diaminodiphenyl ether and 99 g (0.5 mole)

of 4,4'-diaminodiphenylmethane and immediately a temperature was raised to 110° C. The mixture was maintained at that temperature for 20 minutes to make a complete dissolution, thereby forming a uniform solution. Then, a temperature was raised to 200° C. over about 2 hours and reaction was effected at that temperature for 3 hours. During the reaction period, it was observed that fine particles of a polyimide resin precipitated out at about 140° C. Also, the water distilled out during the reaction was immediately removed out of the reaction system.

The resultant yellow-brown fine particles of the polyimide resin dispersed in N-methylpyrrolidone were recovered by filtration, boiled with acetone repeatedly 2 times and then dried at 200° C. under reduced pressure for 5 hours. The polyimide resin fine particles had a nearly spherical shape, an average particle diameter of 8 $\mu$m (as measured by means of the TA - II Type manufactured by Coaltar Counter Co. Ltd., which will be similarly applied hereinbelow), a maximum particle diameter of not more than 40 $\mu$m, a tap bulk density (a hardended apparent density using a measuring cylinder; this will be similarly applied hereinbelow) of 0.32 g/cm$^3$ and a specific surface area of 44 m$^2$/g (as measured by means of the 2200 Type manufactured by Micromeritix Co., Ltd., which will be similarly applied hereinbelow).

(3) Preparation of polyamide-imide resin paste

To 75 g of the polyamide-imide resin solution (resin concentration of 20 % by weight) prepared as described in the above (1) were added 25 g of the polyimide resin fine particles prepared as described in the above (2). The resulting mixture was first kneaded roughly in a mortar and then kneaded by passing through high-speed three rollers six times to produce a polyamide-imide resin paste having dispersed therein the resin fine particles. The paste had an apparent viscosity $\eta_1$ of 730 poises at 1 rpm as measured by means of the E-type viscometer (EHD - U Type manufactured by Tokyo Keiki K.K., which will be similarly applied hereinbelow), an apparent viscosity $\eta_{10}$ of 317 poises at 10 rpm and a thixotropy index $\eta_1/\eta_{10}$ of 2.3. This paste was screen-printed upon a smooth surface of an aluminum base plate at a thickness of approximately 30 $\mu$m, whereupon no sags and runs were observed. This paste did not cause any clogging of screen due to adhesion of the paste and the like even in repeated printings over a long period of time and showed an excellent mechanical stability of a paste in printing. Further, the paste was stoved onto a film at 100° C. for one hour, at 200° C. for 0.5 hour and further at 250° C. for 0.5 hour. It was confirmed that the stoved film retained the same favourable pattern precision as before stoving.

EXAMPLE 2

(1) Preparation of polyamide-imide resin solution
(b) Preparation of a polyamide-imide resin solution

| Component | Amount used (g) | (mol) |
| --- | --- | --- |
| Trimellitic acid anhydride | 192 | 1.00 |
| 4,4'-Methylene-bis-(2-methyl-6-ethylaniline) | 284.8 | 1.01 |
| N-methylpyrrolidone | 477 | |
| Aqueous solution of phosphonic acid (phosphonic acid content, 85%) | 6.9 | 0.06 |

Into a 4-necked flask equipped with a thermometer, a stirrer, a nitrogen inlet tube and a water content analyzer were placed the above components with stirring and a temperature was raised to 160° C. whilst a nitrogen gas was passed therethrough. A temperature was gradually raised to 205° C. whilst the distilled water was removed out of the system and reaction was allowed to proceed at a temperature in the range of 205-210° C. Reaction end point was monitered with a Gardner viscosity to give a N-methylpyrrolidone solution of a polyamide-imide resin having a reduced viscosity (dimethylformamide, 0.5 g/dl, 30° C.) of 0.44 dl/g. This solution was further diluted with N-methylpyrrolidone to approximately 25 % by weight. The diluted solution was poured into water vigorously stirred by a mixer and a solid polyamide-imide resin was recovered. The solid resin was washed well with hot water and methanol and then dried with a hot-air dryer at 150° C. for 6 hours and further with a reduced pressure dryer at 150° C. to afford a powdery polyamide-imide resin. 20 g of the powdery polyamide-imide resin were dissolved in 80 g of cyclohexane to form a solution of a polyamide-imide resin having a resin concentration of 20 % by weight.

(2) Preparation of resin fine particles
(a) Synthesis of dispersing stabilizer

Into a 4-necked flask eqipped with a thermometer, a stirrer and a spherical condensor were placed 185.7 g of ISOPAR-H (trade name of the aliphatic hydrocarbon manufactured by Esso Standard Oil Co., Ltd.), 106.8 g of lauryl methacrylate and 6.1 g of 2-hydroxyethyl methacrylate and a temperature was raised to 100° C. A mixture of 106.9 g of lauryl methacrylate, 24.5 g of 2-hydroxyethyl methacrylate and 2.4 g of benzoyl peroxide paste (benzoyl peroxide content, 50 % by weight) previously prepared was added dropwise over 2 hours with stirring whilst nitrogen gas was passed. Subsequently, the temperature was maintained at 100° C. for one hour and then raised to 140° C. Reaction was allowed to proceed at that temperature for 4 hours. The resulting dispersing stabilizer solution had a nonvolatile content of 55 % by weight when dried at 170° C. for 2 hours, and the dispersing stabillizer had a number-average molecular weight (as determined according to a gel permeation chromatographic method using a calibration curve with the polystyrene having a known molecular weight) of 66,800.

(b) Preparation of fine particles of polyamide-imide resin

Into a 500 ml-volume, 4-necked flask equipped with a thermometer, a stirrer and a spherical condensor were placed, whilst nitrogen gas was passed, 35.1 g of 4,4'-diphenylmethanediisocyanate, 16.3 g of MR-100 (aromatic polyisocyanate manufactured by Nihon Polyurethane K.K.), 19 g of the dispersing strabilizer solution (nonvollatile content: 40 % by weight) prepared as described in the above (a), 150 g of ISOPAR-H and 9.0 g of N-methylpyrrolidone, and a temperature was raised to 100° C. with stirring at 380 rpm. Subsequently, 38.5 g of trimellitic acid anhydride previously finely divided were added thereto and reaction was allowed to proceed at 100° C. for one hour, at 115° C. for one hour, at 125° C. for one hour, at 140° C. for one hour and further at an elevated temperature of 170° C. for 2 hours. The resulting brown fine particles of the polyamide-imide resin dispersed in a continuous ISOPAR-H phase were recovered by filtration, boiled with water and methanol, recovered by filtration and dried at 60° C. under reduced pressure for 5 hours. The resultant fine particles of a polyamide-imide resin showed, in its IR absorption spectrum, absorption for imide bond at 1,780 cm$^{-1}$ and absorption for amide bond at 1,650 cm$^{-1}$ and 1,540 cm$^{-1}$ and polyamide-imide resin of fine particles had an average particle diameter of about 3 μm, a maximum particle diameter of not more than 40 μm, a tap bulk density of 0.63 g/cm$^3$ and a specific surface area of 2.0 m$^2$/g.

(3) Preparation of polyamide-imide resin paste

To 75g of the polyamide-imide resin solution prepared as described in the above (1)(resin concentration, 20% by weight) were added 25 g of the polyamide-imide resin fine particles prepared as described in the abobe (2),(b). The resulting mixture was first roughly kneaded in a mortar and then kneaded by passing through high-speed three rollers four times to form a polyamide-imide resin paste having dispersing therein the resin fine particles. The paste had an apparent viscosity $\eta_1$ of 1,160 poises at 1 rpm as measured by means of an E-type viscometer, an apparent viscosity $\eta_{10}$ of 483 poises at 10 rpm and a thixotropy index $\eta_1/\eta_{10}$ of 2.4. The paste was screen-printed upon a smooth surface of an aluminium base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing. Further, the paste was stoved onto a film at 100° C. for one hour, at 200° C. for 0.5 hour and further at 250° C. for 0.5 hour. It was confirmed that the stoved film retained the same favourable pattern precision as before stoving.

EXAMPLE 3

(1) Preparation of polyamide-imide resin solution

| Component | Amount used | |
|---|---|---|
| | (g) | (mol) |
| Trimellitic acid anhydride | 192 | 1.0 |
| 4.4'-Methylene-bis-(2,6-diethylaniline) | 313.1 | 1.01 |
| N-Methylpyrrolidone | 505 | |
| Aqueous solution of phosphoric acid (phosphoric acid content, 85%) | 6.9 | 0.06 |

Following the same procedures and apparatus as described in Example 2, (1) except that the above components were employed and the reaction end point was monitored with a Gardner viscosity, there was prepared a powdery polyamide-imide resin having a reduced viscosity of 0.38 dl/g. 25 g of the powdery polyamide-imide resin were dissolved in 75 g of cyclohexane to form a polyamide-imide resin solution having a resin concentration of 25% by weight.

(2) Preparation of polyamide-imide resin paste

To 70 g of the polyamide-imide resin solution prepared as described in the above (1) (resin concentration, 25% by weight) were added 30 g of the polyimide resin fine particles prepared as described in Example 1, (2). The resulting mixture was first kneaded roughly in a mortar and then kneaded by passing through high-speed three rollers four times to form a polyamide-imide resin paste having dispersed therein resin fine particles. The paste had an apparent viscosity $\eta_1$ of 1,980 poises at 1 rpm as measured by means of the E-type viscometer, an apparent viscosity $\eta_{10}$ of 619 poises at 10 rpm and a thixotropy index $\eta_1/\eta_{10}$ of 3.2. The paste was screen-printed onto a smooth surface of an aluminum base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing. Further, the paste was stoved onto a film at 100° C. for one hour, at 200° C. for 0.5 hour and further at 250° C. for 0.5 hour. It was confirmed that the stoved film retained the same favourable pattern precision as before stoving.

EXAMPLE 4

(1) Preparation of polyetheramide-imide resin solution (a) Preparation of a polyamide-imide resin solution

| Component | Amount used | |
|---|---|---|
| | (g) | (mol) |
| Trimellic acid anhydride | 192.0 | 1.00 |
| 2,2-bis[4-(4-aminophenoxy)phenyl]propane | 414.1 | 1.01 |
| N-methylpyrrolidone | 606 | |
| Aqueous solution of phosphonic acid (phosphonic acid content, 85%) | 5.9 | 0.06 |

Into a 4-necked flask equipped with a thermometer, a stirrer, a nitrogen inlet tube and a water content analyzer were placed the above components with stirring and a temperature was raised to 160° C. whilst a nitrogen gas was passed therethrough. A temperature was gradually raised to 205° C. whilst removing distilled water out of the system and reaction was allowed to proceed at a temperature in the range of 205–210° C. Reaction end point was monitered with a Gardner viscosity to give a polyetheramide-imide resin having a reduced viscosity (as measured by use of dimethylformamide as a solvent, at a sample concentration of 0.5 g/dl and at a temperature of 30° C., which will be similarly applied hereinafter) of 0.41 dl/g. A N-methylpyrrolidone solution of the resulting polyetheramide-imide resin was further diluted with N-methylpyrrolidone to approximately 25 % by weight. The diluted solution was poured into water vigorously stirred by a mixer and a solid polyetheramide-imide resin was recovered. The solid resin was washed well with hot water and then with a large amount of water and methanol, collected by filtration, and then dried with a hot-air dryer at 150° C. for 6 hours to afford a powdery polyetheramide-imide resin. 20 g of the powdery polyetheramide-imide resin were dissolved in 80 g of triethylene glycol dimethyl ether to form a solution of a polyetheramide-imide resin having a resin concentration of 20 % by weight.

(2) Preparation of resin fine particles

Resin fine particles were prepared in the same manner as in Example 1, (2).

(3) Preparation of a polyetheramide-imide resin paste

To 75g of the polyetheramide-imide resin solution prepared as described in the above (1) (resin concentration, 20% by weight) were added 25 g of the polyimide resin fine particles prepared as described in the above (2). The resulting mixture was first roughly kneaded in a mortar and then kneaded by passing through high-speed three rollers six times to form a polyetheramide-imide resin paste having dispersed therein the resin fine particles. The paste had an apparent viscosity $\eta_1$ of 475 poises at 1 rpm as measured by means of an E-type viscometer (manufactured by Tokyo Keiki Company, EHD-U type, which will be similarly applied hereinafter), an apparent viscosity $\eta_{10}$ of 130 poises at 10 rpm and a thixotropy index $\eta_1/\eta_{10}$ of 3.7. The paste was screen-printed upon a smooth surface of an aluminium base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing.

Further, the paste was stoved onto a film at 100° C. for one hour, at 200° C. for 0.5 hour and further at 250° C. for 0.5 hour. It was confirmed that the stoved film retained a favourable pattern precision as before stoving.

EXAMPLE 5

(1) Preparation of polyetheramide-imide solution

Following the same procedures and employing the same apparatus and components as described in Example 4, except that the reaction end point was monitored with a Gardner viscosity, there was prepared a powdery polyetheramide-imide resin having a reduced viscosity of 0.57 dl/g. 15 g of the powdery polyetheramide-imide resin were dissolved in 85 g of ethylene glycol dimethyl ether to form a polyetheramide-imide resin solution having a resin concentration of 15% by weight.

(2) Preparation of polyetheramide-imide resin paste

To 75g of the polyamide-imide resin solution prepared as described in the above (1) (resin concentration, 15% by weight) were added 25 g of the polyimide resin fine particles prepared as described in Example 1, (2). The resulting mixture was first roughly kneaded in a mortar and then kneaded by passing through high-speed three rollers six times to form a polyetheramide-imide resin paste having dispersed therein the resin fine particles. The paste had an apparent viscosity $\eta_1$ of 530 poises at 1 rpm as measured by means of an E-type viscometer, an apparent viscosity $\eta_{10}$ of 150 poises at 10 rpm and a thixotropy index $\eta_1/\eta_{10}$ of 3.5. The paste was screen-printed upon a smooth surface of an aluminium base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing.

Further, the paste was stoved onto a film at 100° C. for one hour, at 200° C. for 0.5 hour and further at 250° C. for 0.5 hour. It was confirmed that the stoved film retained a favourable pattern precision as before stoving.

EXAMPLE 6

(1) Preparation of polyetheramide-imide resin solution 24 g of the powdery polyetheramide-imide resin having a reduced viscosity of 0.57 (dl/g) prepared as described in Example 5, (1) were dissolved in a mixed solvent of 50 g of tetraethylene glycol and 26 g of cyclohexane to form a solution of polyetheramide-imide resin paste having a resin concentration of 24 % by weight.

(2) Preparation of polyetheramide-imide resin paste

To 70 % by weight of the polyetheramide-imide resin solution prepared as described in the above (1) (resin concentration, 24% by weight) were added 30 % by weight of the polyimide resin fine particles prepared as described in the above Example 1, (2). The resulting mixture was first roughly kneaded in a mortar and then kneaded by passing through high-speed three rollers six times to form a polyetheramide-imide resin paste having dispersed therein the resin fine particles. The paste had an apparent viscosity $\eta_1$ of 2,320 poises at 1 rpm as measured by means of an E-type viscometer, an apparent viscosity $\eta_{10}$ of 627 poises at 10 rpm and a thixotropy index $\eta_1/\eta_{10}$ of 3.7. The paste was screen-printed upon a smooth surface of an aluminium base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing. Further, the paste was stoved onto a film at 100° C. for one hour, at 200° C. for 0.5 hour and further at 250° C. for 0.5 hour. It was confirmed that the stoved film retained a favourable pattern precision as before stoving.

EXAMPLE 7

(1) Preparation of polyetheramide-imide resin solution 28.5 g of the powdery polyetheramide-imide resin having a reduced viscosity of 0.41 (dl/g) prepared as described in Example 4, (1) were dissolved in 71.5 g of triethylene glycol dimethyl ether to form a solution of polyetheramide-imide resin solution having a resin concentration of 28.5 % by weight.

(2) Preparation of resin fine particles (a) Synthesis of dispersing stabilizer

Dispersing stabilizer was prepared in the same manner as in Example 2, (2), (a).

(b) Preparation of fine particles of polyamide-imide resin

Polyamide-imide resin was prepared in the same manner as in Example 2, (2), (b).

(3) Preparation of polyetheramide-imide resin paste

To 75g of the polyetheramide-imide resin solution prepared as described in the above (1) (resin concentration, 28.5 % by weight) were added 25 g of the polyamide-imide resin fine particles prepared as described in the above (2),(b). The resulting mixture was first roughly kneaded in a mortar and then kneaded by passing through high-speed three rollers six times to form a polyetheramide-imide resin paste. The paste had an apparent viscosity $\eta_1$ of 1,010 poises at 1 rpm as measured by means of an E-type viscometer, an apparent viscosity $\eta_{10}$ of 404 poises at 10 rpm and a thixotropy index $\eta_1/\eta_{10}$ of 2.5. The paste was screen-printed upon a smooth surface of an aluminium base plate at a thickness of approximately 30 μm, whereupon no sags and runs were observed. This paste did not cause any clogging of screen due to adhesion of the paste and the like even in repeated printings over a long period of time and showed an excellent mechanical stability of a paste in printing. Further, the paste was stoved onto a film at 100° C. for one hour, at 200° C. for 0.5 hour and further at 250° C. for 0.5 hour. It was confirmed that the stoved film retained a favourable pattern precision as before stoving.

COMPARATIVE EXAMPLE 1

(1) Preparation of a polyamide-imide resin solution dissolved in a nitrogen-containing solvent

| Component | Amount used | |
|---|---|---|
| | (g) | (mol) |
| Trimellitic acid anhydride | 192 | 1.0 |
| 4,4'-Diaminodiphenylmethane | 202 | 1.02 |
| Aqueous solution of phosphoric acid (phosphoric acid content, 85%) | 6.92 | |
| N-Methylpyrrolidone | 400 | |

The above components other than trimellitic acid anhydride were placed into a 4-necked flask equipped with a stirrer, a nitrogen inlet tube and a water content analyzer and a temperature was gradually raised to 205° C. with stirring and passing nitrogen gas. The mixture was maintained at that temperature for about one hour, cooled to 175° C. and trimellitic acid anhydride was added at the latter temperature over about 10 minutes. Then, reaction was allowed to proceed at an elevated temperature in the range of 205-210° C. The water distilled out after the addition of trimellitic acid anhydride was immediately removed out of the reaction system, and while the N-methypyrrolidone distilled out was simultaneously being supplemented, reaction was allowed to further proceed. The reaction end point was monitored with a Gardner viscosity to give a solution of a polyamide-imide resin in N-methylpyrrolidone having a reduced viscosity of 0.56 (dl/g). This solution was diluted with N-methylpyrrolidone to form a polyamide-imide resin solution having a resin concentration of 20% by weight.

(2) Preparation of polyamide-imide resin paste

To 75 g of the polyamide-imide resin solution prepared as described in the above (1) (resin concentration, 20% by weight) were added 25 g of the polyimide resin fine particles prepared as described in Example 1, (2). The mixture was first kneaded roughly in a mortar and then kneaded by passing through high-speed three rollers six times to form a polyamide-imide resin paste having dispersed therein the resin fine particles. The paste had an apparent viscosity $\eta_1$ of 780 poises at 1 rpm as measured by means of the E-type viscometer, an apparent viscosity $\eta_{10}$ of 300 poises at 10 rpm and a thixotropy index $\eta_1/\eta_{10}$ of 2.6. The paste was screen-printed upon a smooth surface of an aluminium base plate at a thickness of approximately 30 μm, whereupon no sags and runs could not be observed up to the 8th printing and normal print-coating was feasible. However, the paste adhered onto a printing screen to cause clogging after the 8th printing, which made printing impracticable. This demonstrates a poor mechanical stability of the paste in printing.

We claim:

1. A polyamide-imide resin paste which comprises poly-amide-imide resin dissolved in a non-nitrogen-containing solvent to form a solution, wherein resin fine particles are dispersed in said solution in an amount of 1 to 50 % by weight relative to the resulting polyamide-imide resin paste.

2. The polyamide-imide resin paste according to claim 1, wherein said resin fine particles are dispersed in said solution in an amount of 5 to 40 % by weight relative to the resulting polyamide-imide resin paste.

3. The polyamide-imide resin paste according to claim 1, wherein said non-nitrogen-containing solvent is selected from the group consisting of lactones, alicyclic ketones, ethers, phenols, chlorinated aromatic type solvents, dimethylsulfoxide and sulfolane.

4. The polyamide-imide resin paste according to claim 1, wherein said polyamide-imide resin is a resin which is prepared from trimellitic acid or a reactive acid derivative thereof and a diamine or a diisocyanate and is soluble in a non-nitrogen-containing solvent; or a resin which is prepared from trimellitic acid or a reactive acid derivative thereof, a lactam and a diamine or a diisocyanate and is soluble in a non-nitrogen-containing solvent.

5. The polyamide-imide resin paste according to claim 4, wherein said reactive acid derivative of trimellitic acid is selected from the group consisting of trimellitic acid anhydride, trimellitic acid anhydride monochloride, 1,4-dicarboxy-3-N,N-dimethylcarbamoylbenzene, 1,4-dicarboxy-3-carbophenoxybenzene, 1,4-dicarbomethoxy-3-carboxybenzene, and ammonium salts composed of trimellitic acid and ammonia, dimethylamine and triethylamine.

6. The polyamide-imide resin paste according to claim 4, wherein said diamine is selected from the group consisting of aliphatic, alicyclic, heterocyclic, aromatic and silicon diamines.

7. The polyamide-imide resin paste according to claim 6, wherein said diamine is an alkylated aromatic diamine represented by Formula I:

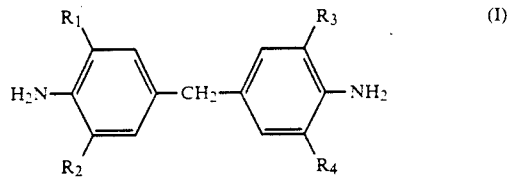

wherein $R_1$, $R_2$, $R_3$ and $R_4$ individually represent an alkyl group having 1 to 6 carbon atoms and they may be the same or different.

8. The polyamide-imide resin paste according to claim 6, wherein said diamine is a diamine having ether linkages represented by Formula III:

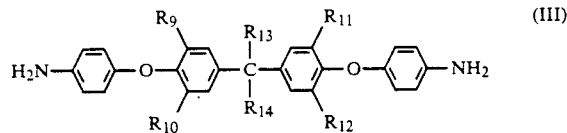

wherein $R_9$, $R_{10}$, $R_{11}$ and $R_{12}$ represent hydrogen, a lower alkyl group, a lower alkoxy group, chlorine or bromine, which may be the same or different, $R_{13}$ and $R_{14}$ represent hydrogen, a methyl group, an ethyl group, a propyl group, a trifluoromethyl group or a trichloromethyl group, which may be the same or different.

9. The polyamide-imide resin paste according to claim 4, wherein said lactam is ε-caprolactam.

10. The polyamide-imide resin paste according to claim 1, wherein said resin fine particles have particle properties of an average particle diameter of not more than 30 μm, a maximum particle diameter of not more than 40 μm, a tap bulk density of not more than $0.8/cm^2$ and a specific surface area of not less than 1 $m^2/g$.

11. The polyamide-imide resin paste according to claim 1, wherein said resin fine particles are aromatic polyamide-imide resin fine particles, aromatic polyimide resin fine particles or aromatic polyamide resin fine particles.

12. The polyamide-imide resin paste according to claim 1, wherein said resin fine particles are of a spherical shape.

13. The polyamide-imide resin paste according to claim 1, wherein said polyamide-imide resin has a molecular weight of 0.3 to 2.0 dl/g in terms of a reduced viscosity.

14. The polyamide-imide resin paste according to claim 1, wherein said polyamide-imide resin solution has a resin content of 5 to 50 % by weight.

15. The polyamide-imide resin paste according to claim 1, wherein said polyamide-imide resin solution has a thixotropy of not less than 1.5.

16. The polyamide-imide resin paste according to claim 1, wherein
said resin fine particles are dispersed in said solution in an amount of 5 to 40% by weight relative to the resulting polyamide-imide resin paste,
said non-nitrogen-containing solvent is selected from the group consisting of lactones, alicyclic ketones, ethers, phenols, chlorinated aromatic type solvents, dimethylsulfoxide and sulfolane,
said polyamide-imide resin is a resin which is prepared from trimellitic acid or a reactive acid derivative thereof and a diamine or a diisocyanate, and is soluble in the non-nitrogen-containing solvent; or a resin which is prepared from trimellitic acid or a reactive acid derivative thereof, a lactam and a diamine or a diisocyanate and is soluble in the non-nitrogen-containing solvent, and
said polyamide-imide resin solution has a thixotropy of not less than 1.5.

17. The polyamide-imide resin paste according to claim 16, wherein said reactive acid derivative of trimellitic acid is selected from the group consisting of trimellitic acid anhydride, trimellitic acid anhydride monochloride,
1,4-dicarboxy-3-N,N-dimethylcarbamoylbenzene,
1,4-dicarboxy-3-carbophenoxybenzene,
1,4-dicarbomethoxy-3-carboxybenzene, and ammonium salts composed of trimellitic acid and ammonia dimethylamine and triethylamine.

18. The polyamide-imide resin paste according to claim 16, wherein said diamine is selected from the group consisting of aliphatic, alicyclic, heterocyclic, aromatic and silicon diamines.

19. The polyamide-imide resin paste according to claim 16, wherein said resin fine particles have particle properties of an average particle diameter of not more than 30 μm, a maximum particle diameter of not more than 40 μm, a tap bulk density of not more than $0.8/cm^2$ and a specific surface area of not less than 1 $m^2/g$.

20. The polyamide-imide resin paste according to claim 16, wherein said resin fine particles are aromatic polyamide-imide resin fine particles, aromatic polyamide resin fine particles or aromatic polyimide resin fine particles.

21. The polyamide-imide resin paste according to claim 1 wherein
said non-nitrogen containing solvent is an ether and
said resin fine particles are aromatic polyamide-imide resin fine particles.

22. The polyamide-imide resin paste according to claim 21 wherein the non-nitrogen containing solvent is tetrahydrofuran, dioxand, 1,2-dimethyloxyethane, diethylene glycol dimethyl ether, triethylene glycol dimethyl ether or tetramethylene glycol dimethyl ether.

* * * * *